United States Patent
Fu et al.

(10) Patent No.: US 10,192,513 B2
(45) Date of Patent: Jan. 29, 2019

(54) CIRCUITS FOR PROCESSING A VOLTAGE OF A PIXEL ELECTRODE AND DISPLAY APPARATUSES

(71) Applicants: BOE Technology Group Co., Ltd., Beijing (CN); Chongqing BOE Optoelectronics Technology Co., Ltd., Chongqing (CN)

(72) Inventors: Siqing Fu, Beijing (CN); Shuai Chen, Beijing (CN); Xianyong Gao, Beijing (CN); Lisheng Liang, Beijing (CN); Bo Xu, Beijing (CN); Lijun Xiao, Beijing (CN); Yin-Jen Hsu, Beijing (CN); Fei Shang, Beijing (CN); Shaohong Gao, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/531,374

(22) PCT Filed: Jun. 1, 2016

(86) PCT No.: PCT/CN2016/084272
§ 371 (c)(1),
(2) Date: May 26, 2017

(87) PCT Pub. No.: WO2017/161690
PCT Pub. Date: Sep. 28, 2017

(65) Prior Publication Data
US 2018/0047365 A1    Feb. 15, 2018

(30) Foreign Application Priority Data
Mar. 21, 2016   (CN) .......................... 2016 1 0162493

(51) Int. Cl.
*G09G 3/36*   (2006.01)
*G02F 1/1337*   (2006.01)
(Continued)

(52) U.S. Cl.
CPC ......... *G09G 3/3696* (2013.01); *G02F 1/1345* (2013.01); *G02F 1/133707* (2013.01);
(Continued)

(58) Field of Classification Search
CPC ......... G02F 1/133707; G02F 1/134309; G02F 1/1345; G02F 1/136204; G09G 3/3696; H01L 2021/775
See application file for complete search history.

(56) References Cited

U.S. PATENT DOCUMENTS 8,576,149 B2    11/2013   Zhao
9,229,493 B2    1/2016    Mishima et al.
(Continued)

FOREIGN PATENT DOCUMENTS

CN    101694765 A    4/2010
CN    103065594 A    4/2013
(Continued)

OTHER PUBLICATIONS

Second Office Action for Chinese Patent Application No. 201610162493.8, dated Feb. 13, 2018, 20 pages.
(Continued)

*Primary Examiner* — Dmitriy Bolotin
(74) *Attorney, Agent, or Firm* — Westman, Champlin & Koehler, P.A.

(57) ABSTRACT

The present disclosure provides a circuit for processing a voltage of a pixel electrode and a display apparatus. The circuit for processing a voltage of a pixel electrode comprises: a first input terminal configured to input an original voltage of the pixel electrode; a second input terminal configured to input a voltage of a common electrode; and an output terminal configured to output a processed voltage of the pixel electrode, wherein the circuit for processing a voltage of a pixel electrode is configured to superimpose the
(Continued)

voltage of the common electrode on the original voltage of the pixel electrode, to acquire a voltage which is stable with respect to the voltage of the common electrode as the processed voltage of the pixel electrode.

12 Claims, 4 Drawing Sheets

(51) Int. Cl.
G02F 1/1343 (2006.01)
G02F 1/1345 (2006.01)
G02F 1/1362 (2006.01)
H01L 21/77 (2017.01)

(52) U.S. Cl.
CPC .. *G02F 1/134309* (2013.01); *G02F 1/136204* (2013.01); *G09G 3/3688* (2013.01); *H01L 2021/775* (2013.01)

(56) References Cited

U.S. PATENT DOCUMENTS

| | | |
|---|---|---|
| 2007/0024560 A1 | 2/2007 | Kim et al. |
| 2007/0146276 A1* | 6/2007 | Syu ..................... G09G 3/3655 345/92 |
| 2008/0303967 A1* | 12/2008 | Huang ................. G09G 3/3655 349/39 |
| 2012/0007901 A1* | 1/2012 | Yen ..................... G09G 3/3648 345/698 |
| 2014/0168043 A1* | 6/2014 | Zhang ................. G09G 3/3692 345/90 |
| 2017/0069284 A1 | 3/2017 | Wang |
| 2017/0186396 A1 | 6/2017 | Li et al. |

FOREIGN PATENT DOCUMENTS

| | | |
|---|---|---|
| CN | 102183852 B | 7/2013 |
| CN | 104795036 A | 7/2015 |
| CN | 105070260 A | 11/2015 |
| CN | 105576356 A | 5/2016 |
| JP | 2012234080 A | 11/2012 |

OTHER PUBLICATIONS

International Search Report and Written Opinion for International Application No. PCT/CN2016/084272, dated Dec. 22, 2016, 10 pages.

English translation of International Search Report and Written Opinion for International Application No. PCT/CN2016/084272, 8 pages.

First Office Action from Chinese Patent Application No. 201610162493. 8, dated Jul. 27, 2017, 17 pages.

\* cited by examiner

CIRCUITS FOR PROCESSING A VOLTAGE OF A PIXEL ELECTRODE AND DISPLAY APPARATUSES

CROSS-REFERENCE TO RELATED APPLICATION(S)

The present application is a U.S. National Phase Application of PCT Application No. PCT/CN2016/084272, filed on Jun. 1, 2016, entitled "CIRCUITS FOR PROCESSING A VOLTAGE OF A PIXEL ELECTRODE AND DISPLAY APPARATUSES," which claims priorities to Chinese Patent Application No. CN201610162493.8, filed on Mar. 21, 2016, which is incorporated herein by reference in its entirety.

TECHNICAL FIELD

Embodiments of the present disclosure relate to the field of liquid crystal display technology, and more particularly, to circuits for processing a voltage of a pixel electrode and display apparatuses.

BACKGROUND

Liquid crystal flat displays, particularly Thin Film Transistor Liquid Crystal Displays (TFT-LCDs), are currently only display devices which catch up with or even surpass Cathode Ray Tubes (CRTs) in all directions in terms of overall performance such as brightness, contrast, power consumption, life, volume and weight etc. The liquid crystal flat displays have become the current mainstream display products due to excellent performance, good large-scale production characteristics, a high degree of automation, a low cost of raw materials, and a wide development space thereof.

SUMMARY

The embodiments of the present disclosure provide a circuit for processing a voltage of a pixel electrode and a display apparatus, which at least partly eliminates the influences of the voltage fluctuation of the common electrode on the charging of the liquid crystal layer.

According to an aspect of the embodiments of the present disclosure, there is provided a circuit for processing a voltage of a pixel electrode. The circuit for processing a voltage of a pixel electrode comprises: a first input terminal configured to input an original voltage of the pixel electrode; a second input terminal configured to input a voltage of a common electrode; and an output terminal configured to output a processed voltage of the pixel electrode. In the embodiments, the circuit for processing a voltage of a pixel electrode is configured to superimpose the voltage of the common electrode on the original voltage of the pixel electrode, to acquire a voltage which is stable with respect to the voltage of the common electrode as the processed voltage of the pixel electrode.

In the embodiments, the circuit for processing a voltage of a pixel electrode further comprises: an operational amplifier having a negative phase input terminal connected to the ground through a first resistor and connected to an output terminal thereof through a second resistor; a third resistor having a first end connected to the first input terminal and a second end connected to a positive phase input terminal of the operational amplifier; and a fourth resistor having a first end connected to the second input terminal and a second end connected to the positive phase input terminal of the operational amplifier. In the embodiments, the output terminal of the operational amplifier is connected to the output terminal of the circuit for processing a voltage of a pixel electrode.

In the embodiments, the circuit for processing a voltage of a pixel electrode further comprises: a filter capacitor connected between the second input terminal and the first end of the fourth resistor.

In the embodiments, a resistance value of the second resistor and a resistance value of the fourth resistor satisfy:

$$K = \frac{R_2}{R_4}$$

wherein K is a superposition multiple of a dynamic fluctuation voltage waveform of the common electrode, $R_2$ is a resistance value of the second resistor, and $R_4$ is a resistance value of the fourth resistor.

In the embodiments, the second resistor is a fixed resistor, and the fourth resistor is a variable resistor.

In the embodiments, the resistance value of the fourth resistor is on the order of kΩ.

In the embodiments, a resistance value of the third resistor is equal to the resistance value of the second resistor.

According to another aspect of the embodiments of the present disclosure, there is provided a display apparatus. The display apparatus comprises: gate lines, data lines, and a number of pixel units arranged in an array. Each pixel unit comprises a thin film transistor, a pixel electrode, a common electrode, and the circuit for processing a voltage of a pixel electrode as described above. In the embodiments, the circuit for processing a voltage of a pixel electrode has a first input terminal connected to a drain of the thin film transistor, a second input terminal connected to the common electrode, and an output terminal connected to the pixel electrode, and the thin film transistor has a gate connected to a gate line, and a source connected to a data line.

DETAILED DESCRIPTION

Figure 1A:
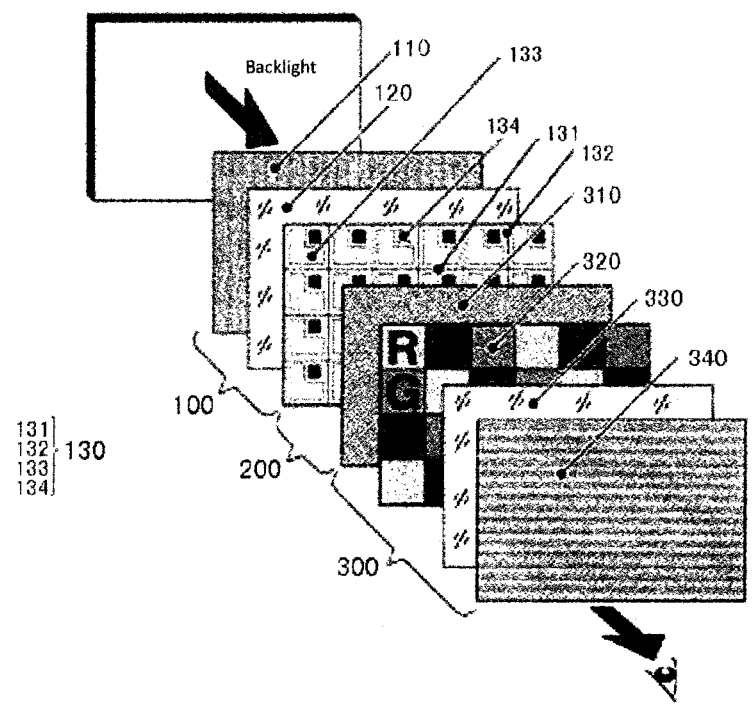
FIGS. 1A and 1B are diagrams of a three-dimensional structure and a cross-sectional structure of a TFT-LCD in the prior art respectively.
Figure 1B:
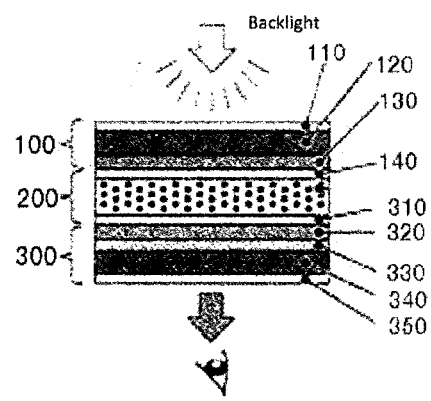

FIGS. 1A and 1B are diagrams of a three-dimensional structure and a cross-sectional structure of a TFT-LCD in the prior art, respectively. As shown in FIGS. 1A and 1B, the TFT-LCD is mainly composed of three parts, which are a rear plate module 100, a liquid crystal layer 200, and a front plate module 300. The rear plate module 100 is a portion behind the liquid crystal layer, and is mainly composed of a rear polarizing plate 110, a rear glass plate 120, a rear plate circuit 130, a rear alignment film 140 etc. The rear plate circuit 130 is formed on the rear glass plate and comprises gate lines 131, data lines 132, pixel electrodes 133, thin film transistors 134 etc.

The front plate module 300 is a portion in front of the liquid crystal layer, and is mainly composed of a front alignment film 310, common electrodes 320, a color filtering sheet 330, a front glass plate 340, a front polarizing sheet 350 etc. The front glass plate 340 is attached with the color filtering sheet 330, and is formed together with the common electrodes 320. A liquid crystal layer 200 is sandwiched between the two glass plates, i.e., the front glass plate and the rear glass plate. For the TFT-LCD, each pixel unit may be structurally regarded as a liquid crystal layer being sandwiched between a pixel electrode and a common electrode, and the liquid crystal layer may be equivalent to a liquid crystal capacitor $C_{LC}$.

Figure 2A:
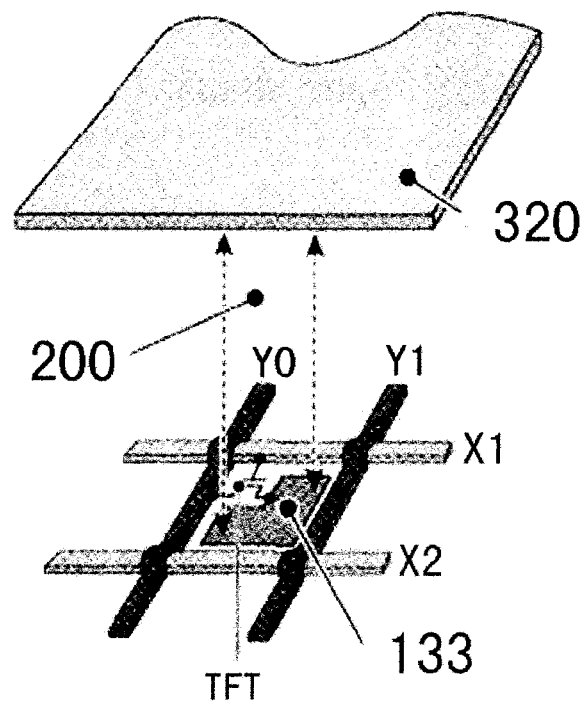
FIGS. 2A and 2B are a structural diagram and an equivalent circuit diagram of a pixel unit in the TFT-LCD respectively.
Figure 2B:
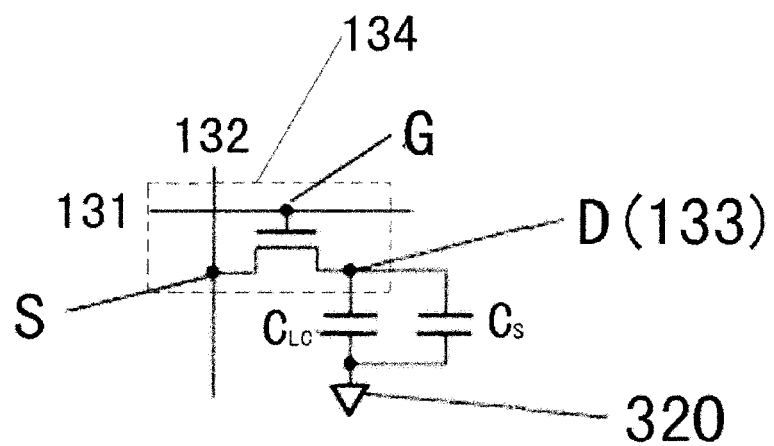

FIGS. 2A and 2B are a structural diagram and an equivalent circuit diagram of a pixel unit in the TFT-LCD respectively. As shown in FIGS. 2A and 2B, the thin film transistor 134 has a gate (G electrode) connected to a gate line 131, a source (S electrode) connected to a data line, and a drain (D electrode) connected to a pixel electrode (133). In practical applications, a liquid crystal capacitor $C_{LC}$ is charged by a pixel electrode and a common electrode on both sides.

The liquid crystal capacitor $C_{LC}$ has a capacitance value of about 0.1 pF. However, the liquid crystal capacitor $C_{LC}$ itself cannot maintain a voltage thereof until picture data is refreshed the next time (it needs to maintain the voltage for 16 ms for a normal picture refresh rate of 60 Hz). As the voltage changes, the displayed color scale may be incorrect. Therefore, when a panel is generally designed, a storage capacitor $C_S$ (which is generally formed by traces of the pixel electrode 133 and the common electrode 320) with a capacitance value of about 0.5 pF is added, so that the voltage of the liquid crystal capacitor $C_{LC}$ which is fully charged can be maintained until the picture is updated the next time.

However, in the pixel unit, the common electrode 320 is affected by other factors and thus may produce some ripple voltage or peak voltage. Further, when the liquid crystal capacitor $C_{LC}$ is charged between the pixel electrode 133 and the common electrode 320, the voltage output of the pixel electrode 133 with respect to the common electrode 320 may fluctuate to form a voltage difference. In this case, liquid crystal rotation will affect normal output of the gray scale, and abnormalities of some pictures such as crosstalk, greenish abnormality etc. may occur, or undesirable phenomena for example residual images such as bright, dark lines etc. may happen.

According to the embodiments of the present disclosure, the fluctuation voltage of the common electrode is superimposed on the original voltage of the pixel electrode so that a voltage outputted by the pixel electrode is stably output with respect to the voltage of the common electrode, and thereby the pixel display gray scale is not affected by the voltage fluctuation of the common electrode, which eliminates abnormal phenomena of pictures and maintain normal display of the pictures.

In order to make the purposes, technical solutions and advantages of the present disclosure more clear and apparent, the present disclosure will be described in further detail below in conjunction with specific embodiments and with reference to the accompanying drawings.

Figure 3:
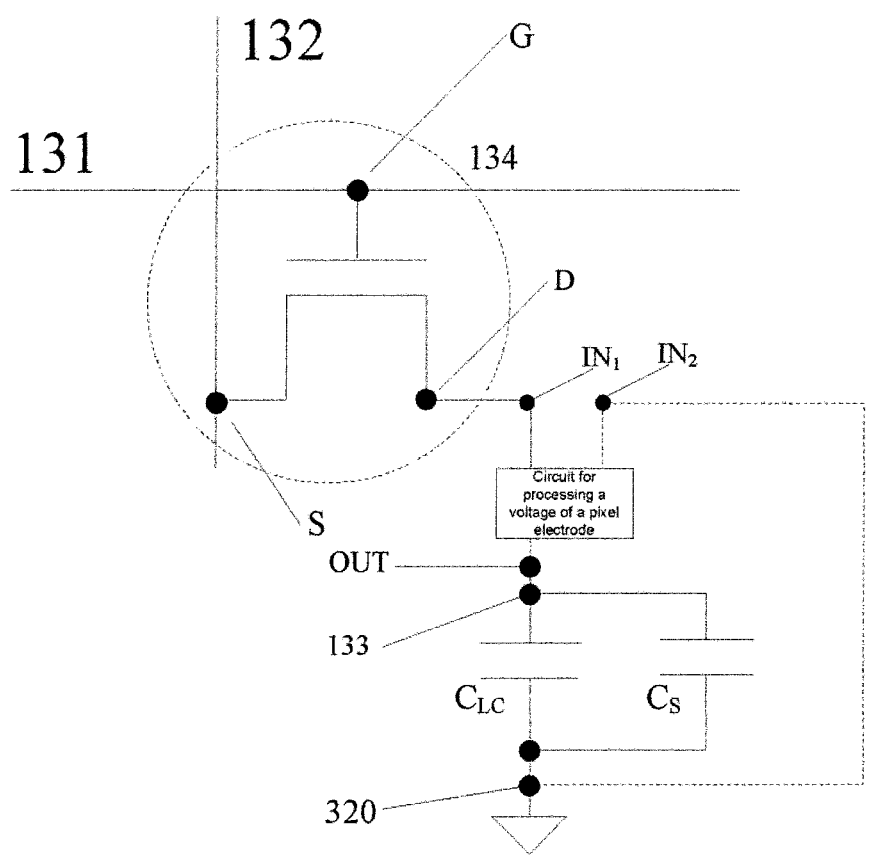
FIG. 3 is a circuit diagram of a pixel unit in a TFT-LCD according to an embodiment of the present disclosure.

FIG. 3 is a circuit diagram of a pixel unit in a TFT-LCD according to an embodiment of the present disclosure. In an example embodiment of the present disclosure, an equivalent circuit diagram of the pixel unit in the TFT-LCD as shown in FIG. 3 comprises a circuit for processing a voltage of a pixel electrode, comprising: a first input terminal $IN_1$ configured to input an original voltage (i.e., Data Voltage in FIG. 4) of the pixel electrode; a second input terminal $IN_2$ configured to input a voltage (i.e., $V_{com}$ Feedback in FIG. 4) of a common electrode; and an output terminal OUT configured to output a processed voltage (i.e., Data Output in FIG. 4) of the pixel electrode. The circuit for processing a voltage of a pixel electrode is configured to superimpose the voltage (i.e., $V_{com}$ Feedback) of the common electrode on the original voltage (i.e., Data Voltage) of the pixel electrode, to acquire a voltage which is stable with respect to the voltage of the common electrode as the processed voltage (i.e., Data Output) of the pixel electrode.

Similarly to FIG. 2B, in the present embodiment, the first input terminal $IN_1$ is connected to a drain (D electrode) of the thin film transistor 134, the second input terminal $IN_2$ is connected to the common electrode 320, and the output terminal OUT of the circuit for processing a voltage of a pixel electrode is connected to the pixel electrode 133. A structure of the thin film transistor will not be described in detail here as many technical contents thereof have been disclosed in the prior art.

As described above, the thin film layer may be equivalent to a liquid crystal capacitor $C_{LC}$. Similarly to FIG. 2B, in the pixel unit according to the present embodiment, a storage capacitor $C_S$ is also comprised, which has two ends connected to two ends of the liquid crystal capacitor $C_{LC}$, to enable a voltage of the liquid crystal capacitor $C_{LC}$ which is fully charged to be maintained until pictures are updated the next time.

Figure 4:
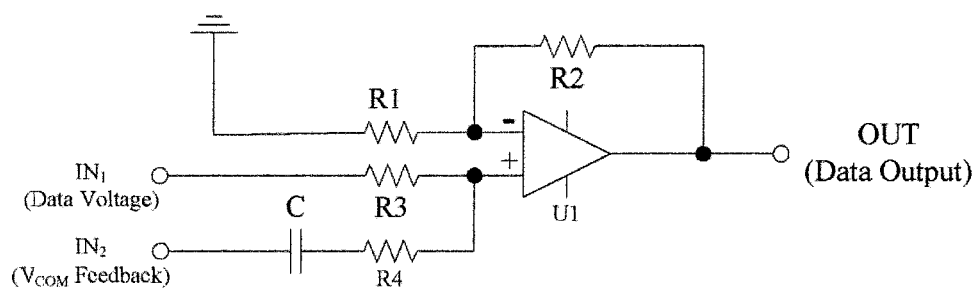
FIG. 4 is a diagram of a circuit for processing a voltage of a pixel electrode in the circuit of the pixel unit shown in FIG. 3.

FIG. 4 is a diagram of a circuit for processing a voltage of a pixel electrode in the circuit of the pixel unit shown in FIG. 3. As shown in FIG. 4, the circuit for processing a voltage of a pixel electrode according to the present embodiment comprises: an operational amplifier U1 having a negative phase input terminal connected to the ground through a first resistor R1 and connected to an output terminal thereof through a second resistor R2; a third resistor R3 having a first end connected to the first input terminal $IN_1$ and a second end connected to a positive phase input terminal of the operational amplifier U1; and a filter capacitor C having a first end connected to the second input terminal $IN_2$ and a second end connected to the positive phase input terminal of the operational amplifier U1 through a fourth resistor R4. The output terminal OUT of the operational amplifier, as the output terminal of the circuit for processing a voltage of a pixel electrode, outputs the processed voltage (i.e., Data Output) of the pixel electrode.

Figure 5:
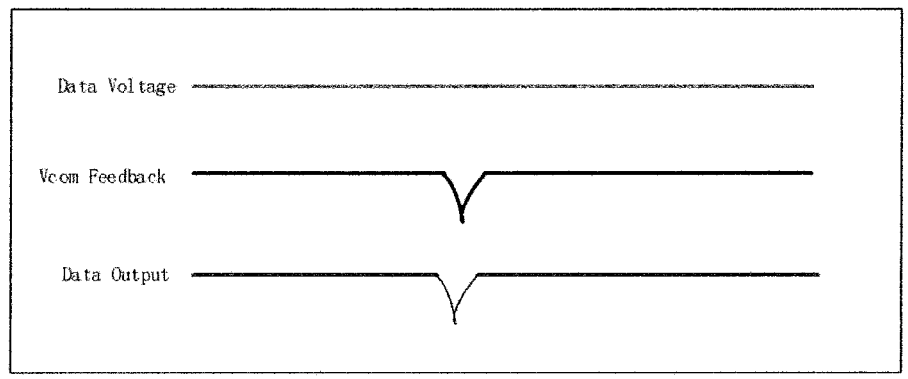
FIG. 5 is waveform diagrams of an original voltage of a pixel electrode, a voltage of a common electrode, and a processed voltage of the pixel electrode in the circuit for processing a voltage of a pixel electrode shown in FIG. 4.

In the present embodiment, the operational amplifier U1, the first resistor R1, the second resistor R2, the third resistor R3, the fourth resistor R4 and the filter capacitor C constitute an additive operation circuit. As shown in FIG. 5, a dynamic fluctuation voltage waveform (i.e., $V_{com}$ Feedback) of the common electrode is superimposed on an original voltage waveform (i.e., Data Voltage) of the pixel electrode, so that the output voltage waveform (i.e., Data Output) is superimposed with the dynamic fluctuation signal of the common electrode, and is then output to the pixel electrode. Thereby, a charging voltage of the pixel electrode is a stable normal voltage with respect to the common electrode, and the output gray scale of the pixel electrode does not have deviation and instead is normal.

In the present embodiment, the filter capacitor C is configured to filter a direct current component from the dynamic fluctuation voltage waveform (i.e., $V_{com}$ feedback) of the common electrode, and leave only a ripple voltage or peak voltage portion in the dynamic fluctuation voltage. When the direct current component is not taken into account, the filter capacitor C may be omitted.

In the present embodiment, the first resistor R1 has a function of isolating an intersection of the first resistor R1 and the second resistor R2, i.e., the negative phase input terminal of the operational amplifier, from the ground.

In the present embodiment, a superposition multiple K of the dynamic fluctuation voltage waveform of the common electrode may be adjusted according to a condition of the TFT LCD. The superposition multiple K is determined by a ratio of the second resistor R relative to the fourth resistor R4, i.e., $$K = \frac{R_2}{R_4}$$

wherein $R_2$ is a resistance value of the second resistor R2 and $R_4$ is a resistance value of the fourth resistor R4. In general, the second resistor R2 is a fixed resistor, and the resistance value $R_2$ thereof is unchanged; and the fourth resistor R4 is a variable resistor. The superposition multiple K of the dynamic fluctuation voltage waveform of the common electrode may be determined by adjusting the resistance value $R_4$ of the fourth resistor R4, wherein $R_4$ is on the order of kΩ.

In addition, in the present embodiment, a resistance value $R_3$ of the third resistor R3 is equal to the resistance value $R_2$ of the second resistor R2.

In a further embodiment of the present disclosure, there is further provided a display apparatus. The display apparatus comprises: gate lines, data lines, and a number of pixel units arranged in an array.

Each pixel unit comprises a thin film transistor, a pixel electrode, a common electrode, and the circuit for processing a voltage of a pixel electrode according to the embodiment. The circuit for processing a voltage of a pixel electrode has a first input terminal connected to a drain of the thin film transistor, a second input terminal connected to the common electrode, and an output terminal connected to the pixel electrode. The thin film transistor has a gate connected to a gate line, and a source connected to a data line.

Heretofore, a number of embodiments of the present disclosure have been described in detail with reference to the accompanying drawings. According to the above description, those of skilled in the art should have a clear understanding of the circuit for processing a voltage of a pixel electrode and the display apparatus according to the present disclosure.

It is to be illustrated that implementations not illustrated or described in the accompanying drawings or the text of the description are in a form known to those of ordinary skill in the art and are not described in detail. In addition, the above-mentioned definitions of the elements are not limited to the various specific structures, shapes or modes mentioned in the embodiments, and those of ordinary skill in the art can make simple changes or substitutions thereon.

In addition, the present disclosure can provide examples of parameters that contain specific values, but these parameters need not be exactly equal to the corresponding values, but may be approximated to the corresponding values within acceptable error tolerances or design constraints. Further, directional terms mentioned in the embodiments, for example, "up", "down", "front", "rear", "left", "right" etc., are only directions in the accompanying drawings, and are not intended to limit the protection scope of the present disclosure.

In summary, in the present disclosure, the dynamic voltage fluctuation (ripple or peak) voltage waveform of the common electrode is superimposed on the original voltage of the pixel electrode so that a charging voltage of the pixel electrode is stably output with respect to the common electrode, and thereby the normal gray scale is output, which avoids occurrence of abnormal picture phenomena for example crosstalk, greenish abnormality, residual images such as bright, dark lines etc., enhance the picture effects and user experience, and therefore has a strong practical value as well as promotion and application prospects.

The foregoing detailed embodiments further describe the purposes, technical solutions and beneficial advantages of the present disclosure in detail, and it is to be understood that the foregoing is only specific embodiments of the present disclosure and is not intended to limit the present disclosure, Any modification, equivalent substitution, improvement etc. made within the spirit and principles of the present disclosure is intended to be included within the protection scope of the present disclosure.

We claim:

1. A circuit for processing a voltage of a pixel electrode, comprising:
   a first input terminal configured to input an original voltage of the pixel electrode;
   a second input terminal configured to input a voltage of a common electrode; and
   an output terminal configured to output a processed voltage of the pixel electrode,
   wherein the circuit for processing a voltage of a pixel electrode is configured to superimpose the voltage of the common electrode on the original voltage of the pixel electrode, to acquire a voltage which is stable with respect to the voltage of the common electrode as the processed voltage of the pixel electrode,
   wherein the circuit for processing a voltage of a pixel electrode further comprises:
   an operational amplifier having a negative phase input terminal connected to the ground through a first resistor and connected to an output terminal thereof through a second resistor;
   a third resistor having a first end connected to the first input terminal and a second end connected to a positive phase input terminal of the operational amplifier; and
   a fourth resistor having a first end connected to the second input terminal and a second end connected to a positive phase input terminal of the operational amplifier;
   wherein a resistance value of the second resistor and a resistance value of the fourth resistor satisfy:

$$K = \frac{R_2}{R_4}$$

wherein K is a superposition multiple of a dynamic fluctuation voltage waveform of the common electrode; $R_2$ is a resistance value of the second resistor, and $R_4$ is a resistance value of the fourth resistor, and
   wherein the fourth resistor is a variable resistor.

2. The circuit according to claim 1,
   wherein the output terminal of the operational amplifier is connected to the output terminal of the circuit for processing a voltage of a pixel electrode.

3. The circuit according to claim 2, further comprising:
a filter capacitor connected between the second input terminal and the first end of the fourth resistor.

4. The circuit according to claim 1, wherein the second resistor is a fixed resistor.

5. The circuit according to claim 1, wherein the resistance value of the fourth resistor is on the order of kΩ.

6. The circuit according to claim 1, wherein a resistance value of the third resistor is equal to the resistance value $R_2$ of the second resistor.

7. A display apparatus comprising: gate lines, data lines, and a number of pixel units arranged in an array,
wherein each pixel unit comprises a thin film transistor, a pixel electrode, a common electrode, and a circuit for processing a voltage of a pixel electrode,
the circuit for processing a voltage of a pixel electrode comprising: a first input terminal configured to input an original voltage of the pixel electrode; a second input terminal configured to input a voltage of a common electrode; and an output terminal configured to output a processed voltage of the pixel electrode,
the circuit for processing a voltage of a pixel electrode is configured to superimpose the voltage of the common electrode on the original voltage of the pixel electrode, to acquire a voltage which is stable with respect to the voltage of the common electrode as the processed voltage of the pixel electrode,
the circuit for processing a voltage of a pixel electrode has a first input terminal connected to a drain of the thin film transistor, a second input terminal connected to the common electrode, and an output terminal connected to the pixel electrode, and
the thin film transistor has a gate connected to a gate line, and a source connected to a data line,
wherein the circuit for processing a voltage of a pixel electrode further comprises:
an operational amplifier having a negative phase input terminal connected to the ground through a first resistor and connected to an output terminal thereof through a second resistor;
a third resistor having a first end connected to the first input terminal and a second end connected to a positive phase input terminal of the operational amplifier; and
a fourth resistor having a first end connected to the second input terminal and a second end connected to a positive phase input terminal of the operational amplifier; and
wherein a resistance value of the second resistor and a resistance value of the fourth resistor satisfy:

$$K = \frac{R_2}{R_4}$$

wherein K is a superposition multiple of a dynamic fluctuation voltage waveform of the common electrode; $R_2$ is a resistance value of the second resistor, and $R_4$ is a resistance value of the fourth resistor, and
wherein the fourth resistor is a variable resistor.

8. The display apparatus according to claim 7,
wherein the output terminal of the operational amplifier is connected to the output terminal of the circuit for processing a voltage of a pixel electrode.

9. The display apparatus according to claim 8, wherein the circuit for processing a voltage of a pixel electrode further comprises:
a filter capacitor connected between the second input terminal and the first end of the fourth resistor.

10. The display apparatus according to claim 7, wherein the second resistor is a fixed resistor.

11. The display apparatus according to claim 7, wherein the resistance value of the fourth resistor is on the order of kΩ.

12. The display apparatus according to claim 7, wherein a resistance value of the third resistor is equal to the resistance value of the second resistor.

* * * * *